United States Patent
Rhie et al.

(10) Patent No.: US 9,257,540 B2
(45) Date of Patent: Feb. 9, 2016

(54) MAGNETIC FIELD EFFECT TRANSISTOR

(71) Applicant: KOREA UNIVERSITY RESEARCH AND BUSINESS FOUNDATION, Seoul (KR)

(72) Inventors: Kungwon Rhie, Chungcheongnam-do (KR); Jin Ki Hong, Seoul (KR); Tae-Yueb Kim, Seoul (KR); Sung-Jung Joo, Seoul (KR); Jin-Seo Lee, Ansan-si (KR); Ku-Youl Jung, Seoul (KR); Dong-Seok Kim, Daegu (KR); Sun-Il Han, Suncheon-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 14/369,188

(22) PCT Filed: Dec. 7, 2012

(86) PCT No.: PCT/KR2012/010657
§ 371 (c)(1),
(2) Date: Jun. 26, 2014

(87) PCT Pub. No.: WO2013/100431
PCT Pub. Date: Jul. 4, 2013

(65) Prior Publication Data
US 2014/0339617 A1    Nov. 20, 2014

(30) Foreign Application Priority Data
Dec. 28, 2011  (KR) .......................... 10-2011-0144335

(51) Int. Cl.
| | | |
|---|---|---|
| *H01L 29/78* | (2006.01) | |
| *H01L 29/66* | (2006.01) | |
| *H01L 29/82* | (2006.01) | |
| *G11C 11/16* | (2006.01) | |

(52) U.S. Cl.
CPC ........ *H01L 29/66984* (2013.01); *H01L 29/784* (2013.01); *H01L 29/82* (2013.01); *G11C 11/161* (2013.01)

(58) Field of Classification Search
CPC ..................................................... H01L 29/784
USPC .......................................................... 257/295
See application file for complete search history.

(56) References Cited

U.S. PATENT DOCUMENTS

| | | | |
|---|---|---|---|
| 6,480,412 B1* | 11/2002 | Bessho et al. ................. | 365/173 |
| 2007/0139826 A1* | 6/2007 | Carey et al. ................... | 360/319 |
| 2007/0165449 A1* | 7/2007 | Zheng et al. .................. | 365/158 |

FOREIGN PATENT DOCUMENTS

| | | |
|---|---|---|
| JP | 2003-31773 | 1/2003 |
| JP | 2004-158750 | 6/2004 |
| KR | 10-2004-0080331 | 9/2004 |
| KR | 10-0506064 | 8/2005 |

OTHER PUBLICATIONS

International Search Report for International Applications No. PCT/KR2012/010657, dated Mar. 6, 2013.

* cited by examiner

*Primary Examiner* — Edward Wojciechowicz
(74) *Attorney, Agent, or Firm* — Kile Park Reed & Houtteman PLLC

(57) ABSTRACT

A magnetic field effect transistor is presented. A magnetic field effect transistor comprises a current control part and a magnetic field applying part. A current control part comprises multiple electrodes and a current flowing material region located between multiple electrodes and in which the amount of current flowing between the electrodes is changed, and a magnetic field applying part applying a magnetic field generating from a magnetization state, which changes according to external input, of a pre-set material. By controlling current by using magnetic fields, high speed operation is possible as charging time is not required, and calculation results may be stored without external power supply because magnetic field is supplied by altering magnetization state of a material according to external input.

6 Claims, 4 Drawing Sheets

MAGNETIC FIELD EFFECT TRANSISTOR

TECHNICAL FIELD

The present invention relates to a semiconductor device, and more particularly, a transistor device controlling currents between source-drain by using a gate input.

BACKGROUND ART

Prior field effect transistors (FET) had currents flow only when electric field was applied to a gate, that is, when connected to a power supply, and thus latched switching by a transistor by itself was impossible. Also, even when a drain is applied to a gate of another transistor, result (drain current) of the front transistor is not stored in the subsequent transistor.

Also, prior field effect transistors (FET) had to charge electric charges until a fixed voltage was charged on a gate, and there were difficulties of having to take sufficient time since gate charging time was required. That is, a limit for high-speed operation was reached.

Also, when trying to store calculation results, since calculation results are preserved only when power is connected as with a SRAM, which uses 5 prior field effect transistors (FET), calculating results had to be transferred to a main memory (DRAM or SRAM).

A data line transferring calculation results is called a bus, and it takes a long period of time to send and receive data (calculation results) again through this bus, and this is the reason for requiring a memory in addition to a CPU.

DISCLOSURE

Technical Problem

The present invention is devised to solve the prior problems described above, and an objective is to provide a latched switching transistor device able to operate at high-speeds as it does not require charge time, and that may store calculation results without external power supply.

Technical Solution

To achieve the objective, a magnetic field effect transistor (FET) in accordance with the present invention comprises a current control part and a magnetic field applying part.

A current control part comprises multiple electrodes and a current flowing material region located between multiple electrodes and in which the amount of current flowing between the electrodes is changed in accordance with externally applied magnetic fields, and a magnetic field applying part applying a magnetic field generated from a magnetization state, which changes according to external input, of a predetermined material.

In this configuration, by controlling currents by using magnetic fields, high speed operation is possible as charging time is not required, and calculation results may be stored without external power supply because magnetic field is supplied by altering magnetic states of a material in accordance with an external input.

Here, a magnetic field applying part may comprise a non-magnetic layer located between ferromagnetic layers. This configuration allows using a magnetic tunnel junction structure for storing calculation results.

Also, this ferromagnetic layer may be formed with a perpendicular magnetic anisotropy material. As such, a magnetic field effect transistor may be further highly integrated by composing a ferromagnetic material with a perpendicular anisotropy material with regards to magnetic tunnel junction structures.

Also, external input may be a current applying input between ferromagnetic materials. According to this configuration, by using spin transfer torque, a magnetic field effect transistor may be further highly integrated.

Also, current applying input may be applied between a magnetic field applying part and an electrode. This composition allows magnetic field effect transistors to be more miniaturized by allowing a magnetic field applying part to use an electrode of current control part commonly.

Also, an insulating layer may be further comprised between a current flowing material region and a magnetic field applying part. This configuration allows preventing currents for generating magnetic fields, not magnetic fields of a magnetic field generating part, from directly influencing output currents.

Advantageous Effects

According to the present invention, by controlling currents by using magnetic fields, high speed operation is possible as charging time is not required, and calculation results may be stored without external power supply because magnetic field is supplied by altering magnetic states of a material in accordance with an external input.

Also, a magnetic tunnel junction structure may be used for storing calculation results.

Also, a magnetic field effect transistor may be further highly integrated by composing a ferromagnetic material with a perpendicular anisotropy material with regards to magnetic tunnel junctions.

Also, by using spin transfer torque phenomenon, magnetic field effect transistor may be further highly integrated.

Also, magnetic transistors may be more miniaturized by allowing a magnetic field applying part to use an electrode of current control part commonly.

Also, by comprising an insulating layer between a current flowing material region and a magnetic field applying part, currents for generating magnetic fields, not a magnetic field of a magnetic field generating part, may be prevented from directly influencing output currents.

BEST MODE

Hereinafter, preferred embodiments of the present invention are described with reference to accompanying drawings.

Figure 1:
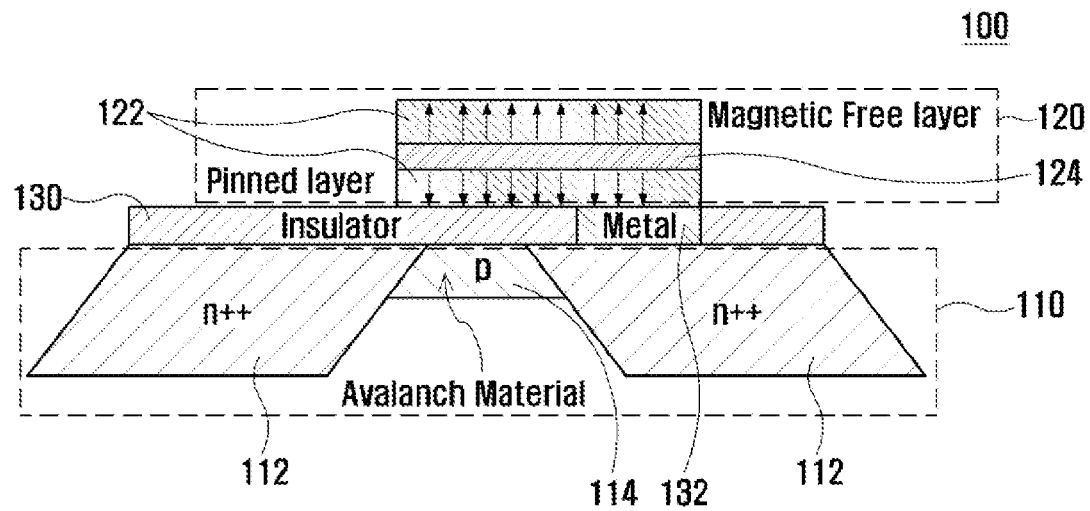
FIG. 1 is a drawing illustrating an outline of a structure of an embodiment of a magnetic field effect transistor in accordance with the present invention.

FIG. 1 is a drawing illustrating an outline of a structure of an embodiment of a magnetic field effect transistor in accordance with the present invention.

In FIG. 1, a magnetic field effect transistor (100) comprises a current control part (110), a magnetic field applying part (120), and an insulating layer (130).

The current control part (110) again comprises multiples electrodes (110) and a current flowing material region (114), and the current flowing material region (114) is located between multiple electrodes (112) and changes the amount of currents flowing between electrodes in accordance with externally applied magnetic fields.

The magnetic field applying part (120) is a region made of current flowing materials that generates pre-set perpendicular magnetic fields changing in accordance with a direction of an external pulse current applied in accordance with a gate.

As such, by controlling currents using magnetic fields, high speed operation is possible since there is no need for charging time, and calculation results may be stored by magnetic fields of a gate, magnetic resistance, and resistance between source and drain even when external power supply is disconnected since magnetic field is supplied by altering magnetization states of a material in accordance with an external current input direction.

The magnetic field applying part (120) may comprise a non-magnetic layer (124) located between ferromagnetic layers (122). This configuration allows using a magnetic tunnel junction structure for storing calculation results.

Also, this ferromagnetic layer (122) may be composed of a perpendicular magnetic anisotropy material. As such, by composing ferromagnetic materials with a perpendicular magnetic anisotropy material with regards to a magnetic tunnel junction structure, a magnetic applying part (120) may be further highly integrated.

Also, external input may be a current applied input between ferromagnetic materials (122). According to this configuration, by using spin transfer torque effects, a magnetic field applying part (120) may be further highly integrated.

Spin transfer torque (STT) is a principle, when currents having current densities that may transfer enough angular momentum to reverse magnetization are applied, the two magnetization layers may be made parallel or anti-parallel in accordance with direction of applied current.

A principle that magnetization may be reversed in accordance with angular momentum of a transferred spin when current, in which spin is aligned from high current densities, is pushed into a magnetization metal layer was proposed in 1996, and this principle is called a spin transfer torque effect, and it has been verified that this principle was realized in a device by making and manufacturing a multiple thin film layer in a FM/M/M or FM/MgO/FM structure to a pillar structure in a nanometer size.

Also, current applied input may be applied between a magnetic field applying part (120) and an electrode (112). This configuration may further miniaturize magnetic field effect transistors (100) by making it able for a magnetic field applying part (120) to use an electrode (112) of a current control part (110) commonly.

Also, an insulating layer (130) may be further comprised between a current flowing material region (114) and a magnetic field applying part (120). This configuration allows preventing currents for magnetic field generation, not a magnetic field of a magnetic field generation part (120), from directly influencing output currents.

In FIG. 1, the whole current control part (110) and magnetic field applying part (120) is blocked by an insulating layer (130), and a metal connection part (132) is formed on a portion of an insulating layer (130) to electrically connect an electrode (112) and a magnetic field applying part (120).

A further detailed description of the described embodiment is as follows.

Figure 2:
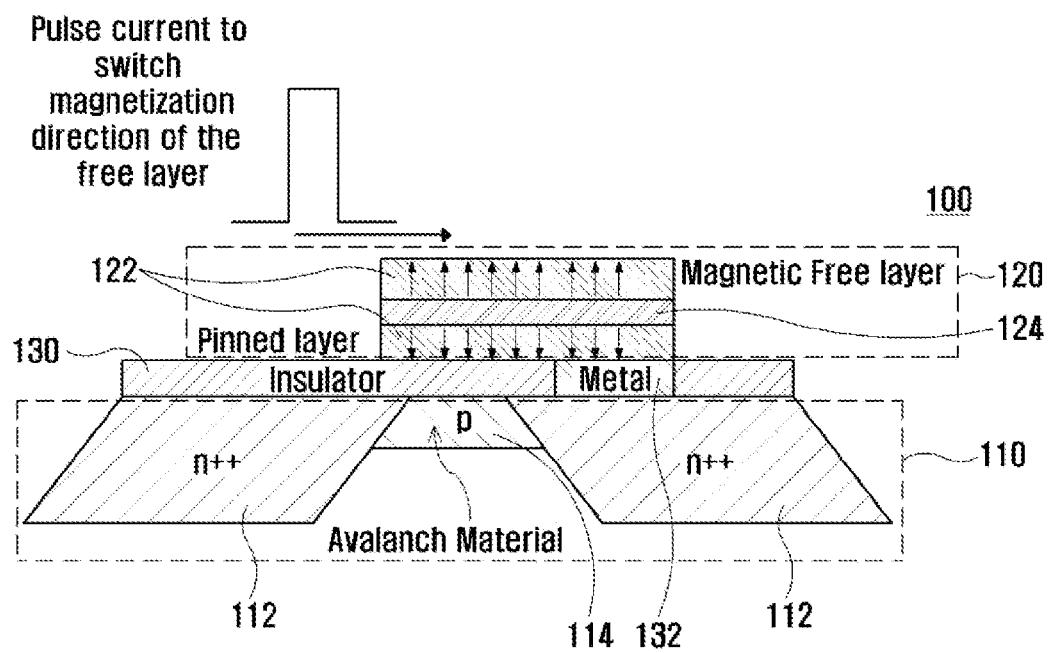
FIG. 2 is a drawing showing an operation of avalanche generating or avalanche effect turning off, from structure of FIG. 1, by a pulse current applied to a gate and made to flow to a drain of 112 and thus reversing magnetization of a magnetic free layer, and accordingly, a magnetic field induced on a lower avalanche material made greater.

FIG. 2 is a drawing showing an operation of avalanche generating or avalanche effect turning off, from structure of FIG. 1, by a pulse current applied to a gate and made to flow to a drain of 112 and thus reversing magnetization of a magnetic free layer, and accordingly, a magnetic field induced on a lower avalanche material made greater.

In FIG. 2, two magnetization layers (122) are inducing a magnetic field. Also, bias is applied from a voltage near where an avalanche will be generated from n++ electrodes (112) of both ends. Direction of magnetization of a free layer is changed by using spin torque transfer to obtain a magnetic field of a gate required for switching.

Magnetization switching is used in the present invention, and the magnetization switching is a phenomenon in which flow of current changes thousands of times or more in accordance with applying of magnetic fields.

Figure 3:
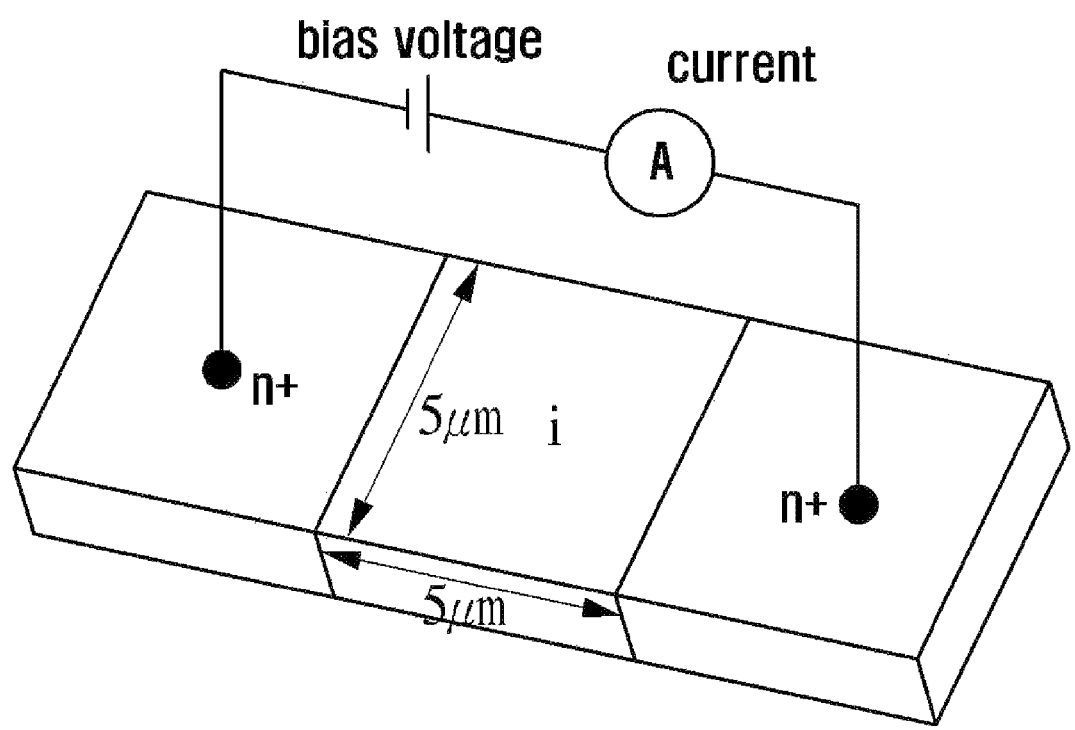
FIG. 3 is a drawing of a current control part of FIG. 2, an outline of a magnetic field effect transistor using a magnetic field avalanche effect of a semiconductor n+/intrinsic/n+ type device developed in accordance with the present invention.
Figure 4:
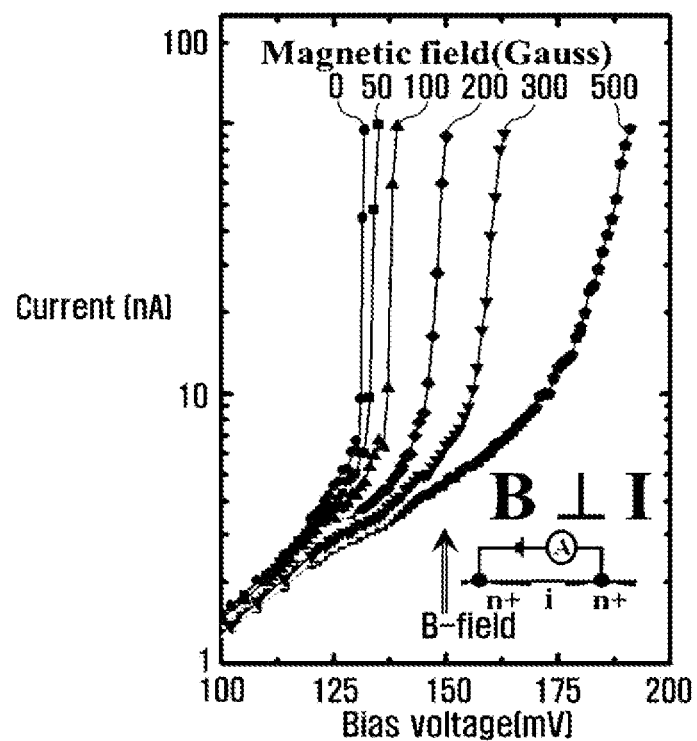
FIG. 4 is a graph illustrating magnetic switching in which switching in accordance with applying a magnetic field in a device of FIG. 3 developed in accordance with the present invention is identifiable.
Figure 4:
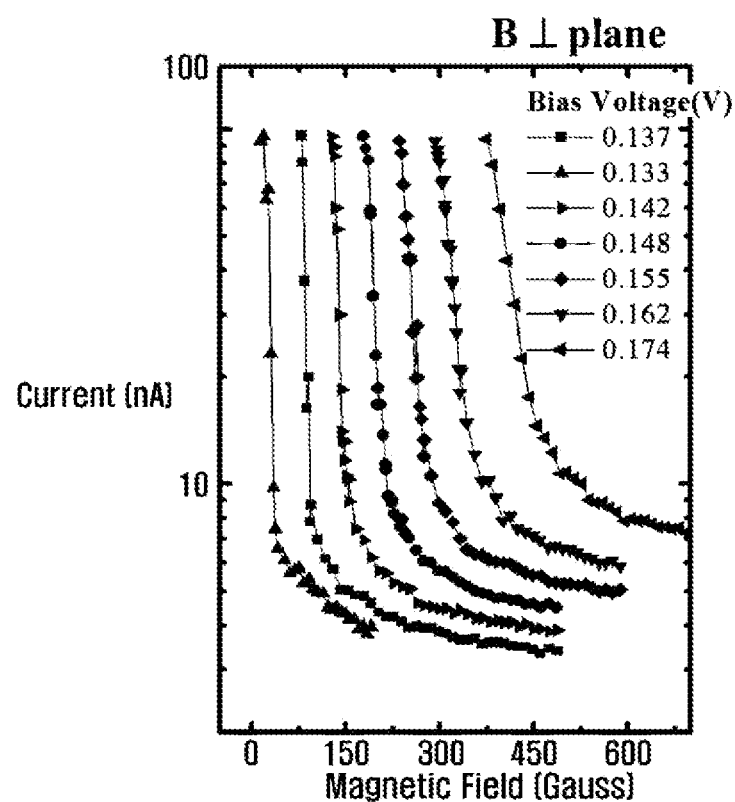

FIG. 3 is a schematic drawing to describe the principle of a current control part of FIG. 2, and FIG. 4 is a graph illustrating a magnetization switch that may be identified in a structure of FIG. 3.

In FIG. 3, a state of applying a bias voltage on a narrow-band gap semiconductor avalanche device having a structure of narrow widths between electrodes is illustrated, and in FIG. 4, a transfer state of a device rapidly changing by magnetic fields may be identified.

Ohm's law has been recognized as a basic law for physical properties research. Ohm's law is applied to all electronic circuits and electronic devices. But when applied electrical field goes over a certain level, rapid flow of current is generated, and in this range, it exceeds Ohm's law and mean field theory does not apply and Mott-Gurney law is applied.

The reason for this non-linear characteristic, as electrical charges are accumulated in a semiconductor in accordance with high applied voltage, is known to result from internal non-linear electrical field distribution in accordance with these electrical charges.

Calculation results from a central processing unit being stored in memory (DRAM) is a general form of current computers and mobile devices. The reason is that the calculation results of CPU are volatile and the results must be stored somewhere.

In the case of realizing calculation results of CPU as non-volatile, process of transferring this to memory is not required and bus (information transfer device of CPU and memory) delay time, which takes up most of computer's time, may be saved.

For this, a device, in which FET is operated by using magnetic fields of magnets, is manufactured in the present invention. Magnetization of a magnet uses spin torque that generates magnetization reversals in time of ins or less. In this case, it is possible to have switching speeds of GHz or higher, and to realize non-volatile FET.

Prior FET using electrical fields always maintains on (or off) state in a state where voltage is applied to a gate. But, in a FET (MFET) using a magnetic field proposed in the present invention, because magnetization state is adjusted by sending currents in a pulse shape and current is controlled in accordance with direction of a magnetization state, applying voltage to a gate always is not required.

Also, since ratio of signal is large (corresponding to thousands of times) than any devices proposed using prior spin, it is a switching device that may replace prior electrical field based FETs right away.

Figure 5:
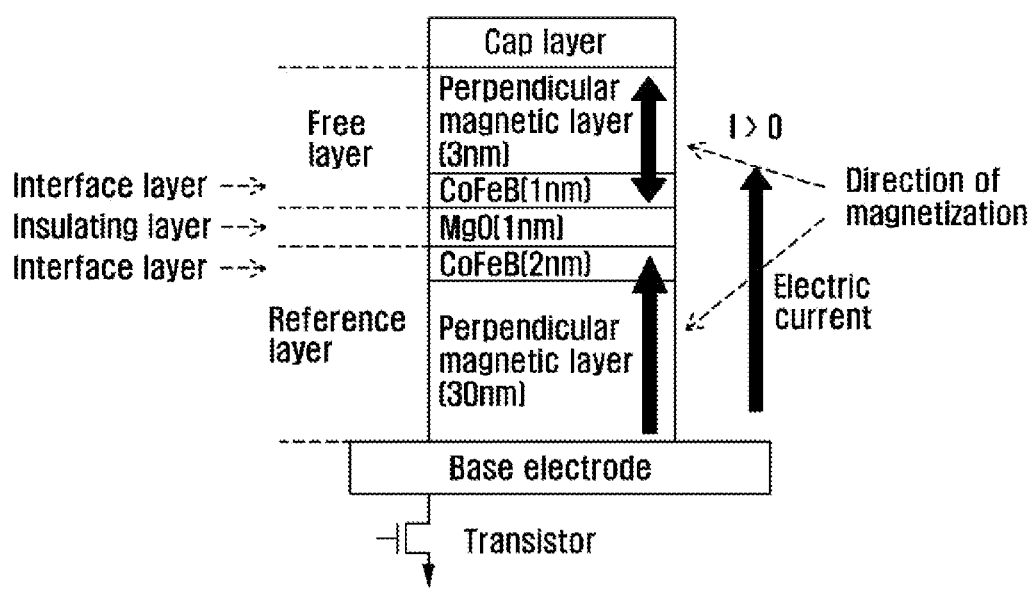
FIG. 5 is a schematic drawing to describe the principle of magnetic applying part of FIG. 2. (Structure of a magnetization layer may be applied as a single layer, multiple layers, multiple magnetization layers with exchange bias, etc. in accordance with magnetization materials.)

FIG. 5 is a schematic drawing to describe the principle of magnetic field applying part of FIG. 2.

Changing direction of a magnet using pulse currents uses spin transfer torque. Pulse currents flow down from top of a gate and flows out to an n++ electrode of right lower portion.

Magnetization direction of a top free layer is reversed in accordance with flowing current, and the size of the total magnetic field added with a bottom pinned layer becomes a large magnetic field when two layers are in parallel, and a small magnetic field when in anti-parallel.

In the case of a large magnetic field, magnetization switching occurs and thus current flows, and in the case of a small magnetic field, switching does not occur and thus current does not flow.

A magnetic field applied to a switching device is designed to be provided from two layers of perpendicular magnetic anisotropy layers located on top of the device. That is, when two perpendicular magnetic anisotropy layers are in anti-parallel, a small leakage magnetic field comes out and thus current flows, and when in parallel, a large leakage magnetic field comes out and thus current does not flow.

Magnetization adjustment of perpendicular magnetic anisotropy layers uses spin torque magnetization reversal. That is, if a magnetization metal (FM)/Cu/FM layer electrically connected to a drain is stacked and a device that may make the size of a leakage magnetic field small (200 Oe) and large (500 Oe) in accordance with magnetization direction of a FET gate is placed on top, a device able to switch a gate with a magnetic field in place of prior FETs, which adjusted a gate with prior electrical fields, may be made.

The greatest characteristics of this device is using a phenomenon in which current flowing in a semiconductor is interrupted in accordance with the size of the applied magnetic field, and parallel and anti-parallel state of a perpendicular magnetic field possesses memory in a form of a leakage magnetic field.

Also, on/off ratio of interrupted currents may easily achieve 1000 times or over, gating at nano sizes is possible, and high speed gating is possible as magnetization reversal of perpendicular magnetic layers is generated in nsec units.

Scientific and technological leap of $20^{th}$ century mankind of development of computers, communications, electronic devices, etc. started from logic switching devices manufactured on the basis of electrical field FET (Field Effect Transistor), in which flow of current is opened and closed in accordance with the size of applied electrical fields.

But, logic calculating element (CPU) and a space (RAM) for storing this calculation result is separate, and possess fundamental limitations of limitations of calculation speed, problems of non-volatility of memory, etc.

A principle of a magnetic field effect transistor (MFET), a device of a new paradigm having both memory and switching functions, is presented, and a new logic switching domain is presented by realizing the same.

Even though the present invention is described by partial preferred embodiments, the scope of the present invention is not limited to this, and covers changes or improvements of the described embodiments from scope of the claims.

The invention claimed is:

1. A magnetic field effect transistor comprising,
    a current control part comprising a pair of electrodes, and a current flowing material region located between the pair of electrodes and in which amount of current flowing between the pair of electrodes is changed in accordance with externally applied magnetic fields; and
    a magnetic field applying part formed on the current flowing material region, and applying a magnetic field generated from a magnetization state of a perpendicular magnetic anisotropy material changing in accordance with external input, to the current flowing material region,
    wherein one of the pair of electrodes is a source region and the other of the pair of electrodes is drain region of the magnetic field effect transistor, the current flowing material region is a channel region of the magnetic field effect transistor, and the magnetic field applying part is a gate region of the magnetic field effect transistor.

2. A magnetic field effect transistor according to claim 1, wherein the magnetic field applying part comprises a non-magnetization layer located between ferromagnetic layers.

3. A magnetic field effect transistor according to claim 2, wherein the ferromagnetic layers are composed of a perpendicular magnetic anisotropy material.

4. A magnetic field effect transistor according to claim 3, wherein the external input is a current applied input between the ferromagnetic materials.

5. A magnetic field effect transistor according to claim 4, wherein the current applied input is applied between the magnetic field applying part and the electrode used as a drain region.

6. A magnetic field effect transistor according to claim 5, wherein an insulating layer is further comprised between the current flowing material region and the magnetic field applying part.

* * * * *